United States Patent [19]

Ito et al.

[11] Patent Number: 6,162,745
[45] Date of Patent: Dec. 19, 2000

[54] FILM FORMING METHOD

[75] Inventors: Shinichi Ito; Katsuya Okumura; Koutarou Sho, all of Yokohama, Japan

[73] Assignee: Kabushiki Kaisha Toshiba, Kawasaki, Japan

[21] Appl. No.: 09/385,363

[22] Filed: Aug. 30, 1999

[30] Foreign Application Priority Data

Aug. 31, 1998 [JP] Japan .................................. 10-245908

[51] Int. Cl.[7] .......................... H01L 21/26; H01L 21/324; H01L 21/42; H01L 21/477
[52] U.S. Cl. .......................... 438/795; 438/781; 438/782; 438/758; 427/581; 427/532; 427/553; 427/510
[58] Field of Search .................................... 438/795, 782, 438/781, 758, 780; 427/581, 558, 532, 553, 510

[56] References Cited

U.S. PATENT DOCUMENTS

| 5,744,397 | 4/1998 | Sheen ...................................... 438/516 |
| 5,840,622 | 11/1998 | Miles et al. .............................. 438/622 |
| 5,989,983 | 11/1999 | Goo et al. ................................ 438/473 |

FOREIGN PATENT DOCUMENTS 10-272407  10/1998  Japan .

OTHER PUBLICATIONS

U.S. application serial No. 09/335,508 has been considered.

*Primary Examiner*—Charles Bowers
*Assistant Examiner*—Hsien-Ming Lee
*Attorney, Agent, or Firm*—Finnegan, Henderson, Farabow, Garrett & Dunner, L.L.P.

[57] ABSTRACT

A film forming method includes the steps of forming a solution film, by dropwise supplying a solution containing solid contents in a solvent and volatilizing the solvent, and selectively forming a film of the solid contents on a to-be-processed substrate at predetermined areas, the method comprising the steps of selectively irradiating an energy beam onto that substrate surface to allow the substrate surface to be modified and forming a filmed area having a high affinity for the solvent and a non-filmed area having a low affinity for the solvent, dropwise supplying the solution to the substrate surface and forming the solution film, and volatilizing the solvent from the solution film and, by doing so, forming a solid contents film selectively on the substrate surface selectively at filmed areas.

19 Claims, 10 Drawing Sheets

FILM FORMING METHOD

BACKGROUND OF THE INVENTION

This invention relates to a film forming method for supplying a solution containing solid contents onto a to-be-processed substrate to form a liquid-like film and, through the volatilization of a solvent in the solution, forming a film of the solid contents on the substrate.

After coating a liquid-like resist film containing solid contents, such as a photosensitive material, in a solvent onto a to-be-processed substrate, such as a wafer, and, through the volatilization of the solvent, forming a solid-like resist film, the resist film for use in a patterning step is exposed with light and developed.

For the coating of a resist solution, the thus far adopted spin-coating method easily forms a uniform film on the surface of a to-be-processed substrate, but there is a problem in that a film is formed also on an alignment area, positional displacement measuring area and substrate's outer periphery, which are not required for an anti-reflection film and resist film, and, for this reason, alignment accuracy is lowered upon exposure with light.

By the use of solution supply nozzles equipped with an interrupt function it is possible to selectively form a solution film onto the substrate. In this method, it is possible to selectively coat the solution film on a wide area of about 100 μm square, but it has not been possible to selectively do so on a narrow area of below a few tens of μm square.

This problem is not restricted to the resist film and a common problem arises in the formation of a solution film by supplying a solution.

BRIEF SUMMARY OF THE INVENTION

As set out above, in the conventional coating method, there is a problem in that a film is also formed on a not-requisite area. In the case where a film is selectively formed by the use of solution supply nozzles equipped with an interrupting function, the problem arises from the fact that the selective coating cannot be done on a narrower area.

It is accordingly the object of the present invention to provide a film forming method capable of selectively forming a solution film on a substrate by the coating of a solution containing solid contents in a solvent and selectively coating a solid-contents film which is formed through the volatilization of the solvent on the substrate at a narrower area.

A film forming method according to the present invention includes forming a solution film, by dropwise supplying a solution containing solid contents in a solvent and volatilization the solvent, and selectively forming a film of the solid contents on a to-be-processed substrate at predetermined areas, the method comprising the steps of:

selectively irradiating an energy beam onto that substrate surface to allow the substrate surface to be modified and forming a filmed area having a high affinity for the solvent and a non-filmed area having a low affinity for the solvent;

dropwise supplying the solution to the substrate surface and forming the solution film; and volatilizing the solvent from the solution film and, by doing so, forming a solid contents film selectively on the substrate surface selectively at filmed areas.

A preferred embodiment of the present invention is as follows.

The solution is a resist solution and the to-be-processed substrate surface irradiated with the energy beam is an anti-reflection film. The filmed area has a contact angle θ of water with respect to the anti-reflection film which ranges in 45°≦θ≦60° and the non-filmed area has a contact angle of the water with respect to the anti-reflection film which exceeds 60°.

According to another method of the present invention, there is provided a film forming method including forming a solution film, by dropwise supplying a solution containing solid contents in a solvent and volatilizing the solvent, and selectively forming a film of the solid contents on a to-be-processed substrate at predetermined areas, the method comprising the steps of:

selectively irradiating an energy beam onto the semiconductor substrate at least with a first irradiation amount and a second irradiation amount and forming a filmed area irradiated with the first irradiation amount and a non-filmed area irradiated with a second irradiation amount, the filmed area having a high affinity for a first solvent in a first solution film directly coated on the surface of the substrate and the non-filmed area having a low affinity for a solvent in at least one solution film coated on the substrate surface after forming a first film through an volatilization of the first solvent in the first solution film;

by volatilizing the first solvent after forming the first solution film on the substrate surface, selectively forming a first film on the substrate surface at the filmed area; and selectively forming one or more films over the first film by the solution film forming step and solvent volatilizing step.

A preferred embodiment of the present invention is as follows.

The solution is a resist solution and the substrate surface irradiated with the energy beam is an anti-reflection film. And the filmed are has a contact angle θ of the water with respect to the anti-reflection film which ranges in 45°≦θ≦60° and the non-filmed area has a contact angle θ of the water with respect to the anti-reflection film which exceeds 60°.

According to another embodiment of the present invention, there is provided a film forming method including forming a solution film, by dropwise supplying a solution containing solid contents in a solvent and volatilizing the solvent, and selectively forming a film of the solid contents on a semiconductor substrate which is situated at a predetermined area over an organic siloxane film formed through baking of an organic siloxane (SiO—Si), the method comprising the steps:

selectively irradiating an energy beam on a surface of the organic siloxane film to allow the surface of the semiconductor substrate to be modified, and forming a filmed area having a high affinity for the solvent and a non-filmed area having a low affinity for the solvent;

dropwise supplying the solution on the organic siloxane film to provide the solution film; and, by volatilizing the solvent from the solution film, forming a film of the solid contents at the filmed area over the surface of the organic siloxane film.

A preferred embodiment of the present invention is as follows:

(a) The contact angle of water with respect to the filmed area is below 60° and the contact angle of the water with respect to the non-filmed area exceeds 60°.

(b) The organic siloxane film is an interlayer insulating film or an anti-reflection film.

The embodiments of the above-mentioned three film forming methods are as set out below.

(1) The energy beam is light having a wavelength of below 250 nm and the energy beam is irradiated to have its irradiation amount monotonically varied from the filmed area toward the non-filmed area.

(2) The solution film forming step includes the step of, while dropwise supplying the solution from solution supply nozzles provided above the semiconductor substrate, moving the substrate ad nozzles relative to each other.

(3) The non-filmed area is an area other than a mark for positional alignment upon exposure, an area having a mark for measuring a light exposure positional misalignment and a semiconductor chip area.

(4) As the solution use is made of a solution containing the solids contents in the solvent, such as an anti-reflection material, resist material, low dielectric material, or an insulating material or interconnection material.

According to the present invention, the energy beam is irradiated on a to-be-processed substrate to allow the surface of the substrate to be modified and, by doing so, an area revealing a high affinity for a solvent and an area revealing a low affinity for the solvent are formed selectively over the substrate surface and, through the coating of a solution containing solid contents in a solvent and the volatilization of the solvent, it is possible to selectively form a solid contents film which reveals a high affinity for the solvent.

Further, since the filmed area (high affinity area) and non-filmed area (low affinity area) are selectively formed by irradiating the energy beam, it is possible to selectively coat very narrow areas in comparison with the conventional technique of selectively coating a solution.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be explained below with reference to the accompanying drawing.

[First Embodiment]

The present invention will be explained below in connection with the method according to which an SOG (Spin On Glass) is spin-coated on a semiconductor substrate surface to form an interlayer insulating film and an anti-reflection film is selectively formed thereon with the use of an anti-reflection material (ARM) solution with the anti-reflection material (solid contents) added to an alcohol solvent.

FIGS. 1A to 1I are the cross-sectional views showing the steps of selectively forming a film in accordance with the first embodiment of the present invention.

Figure 1A:
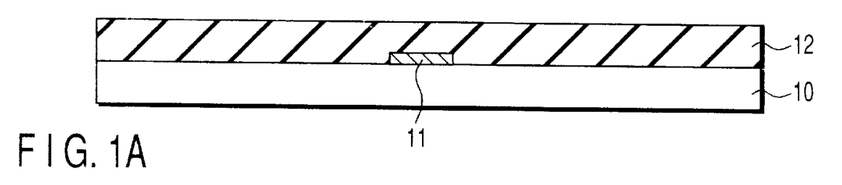
FIGS. 1A to 1I are cross-sectional views showing a selective film formation process according to a first embodiment of the present invention.

As shown in FIG. 1A, an interlayer insulating film (organic siloxane film) 12 using an SOG is formed on a semiconductor substrate 10, such as Si, with an alignment mark 11 formed thereon with the use of a lithography step, and baked. At the time of baking the SOG, temperature-adjusted air lower than the baking temperature is blown on the surface and organic substituent (organic siloxane; SiO—Si) are somewhat left on the surface of the interlayer insulating film 12. Since the organic substituents are present on the surface of the interlayer insulating film thus formed, the surface reveals hydrophobic property and repels alcohol in the ARM solution.

Figure 1B:
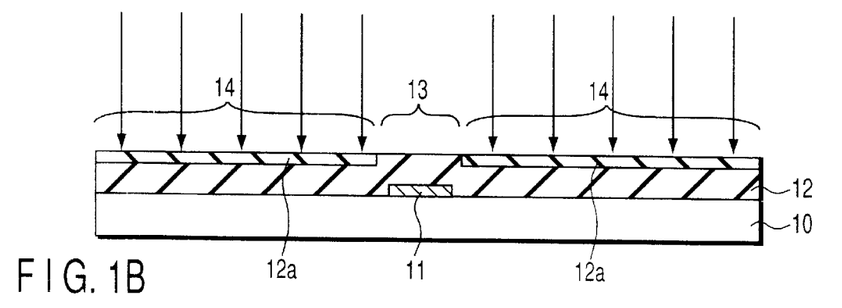

Then, as shown in FIG. 1B, ArF excimer light (193 nm) is selectively irradiated onto the surface of the interlayer insulating film 12 at a measuring area, such as the alignment mark 11, and at an area other than a wafer's peripheral area where a device pattern is not present. By doing so, an interlayer insulating film 12a is formed with surface hydrophilically modified in which case the modified surface of the interlayer insulating film 12a provides a filmed area 14 with an anti-reflection film formed and the unmodified surface of the inter layer insulating film 12 provides a non-filmed area 13 where no anti-reflection area 13 is formed.

Figure 2:
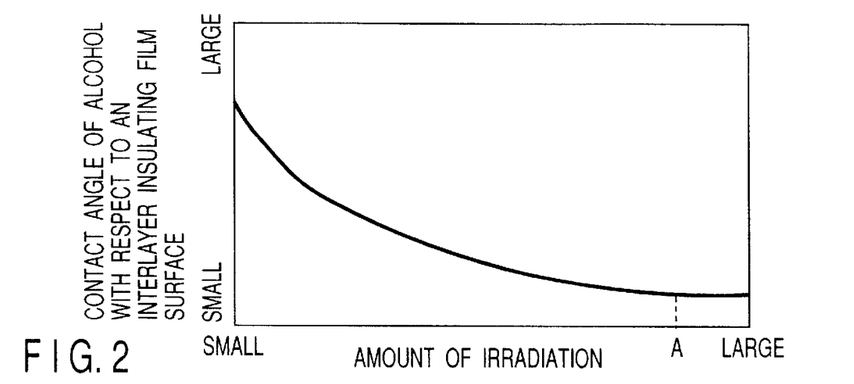
FIG. 2 is a characteristic curve showing a dependency of the wettability of alcohol in an ARM (anti-reflection material) solution to an interlayer insulating film upon an irradiation amount of ArF excimer light.

A preliminary test was conducted. FIG. 2 shows a relation of the irradiation amount of the ArF excimer light to the extent of modification (the wettability of the alcohol used the solvent of an ARM solution to the interlayer insulating film). From FIG. 2 it has been found that, as the irradiation amount of the ArF excimer light is increased, an angle of contact of the solvent in the ARM solution with respect to the interlayer insulating film surface is decreased. This result reveals that, with an increasing amount of irradiation, a bond of the organic substituents on the surface of the interlayer insulating film is broken and that the hydrophilic property is strong.

Based on this result, with an irradiation amount A shown in FIG. 2, the light exposure was selectively made at the area where the anti-reflection film of the interlayer insulating film surface was formed. The irradiation amount A may be so set as to make the contact angle of the water with respect to the surface of the interlayer insulating film below 60°.

Figure 1C:
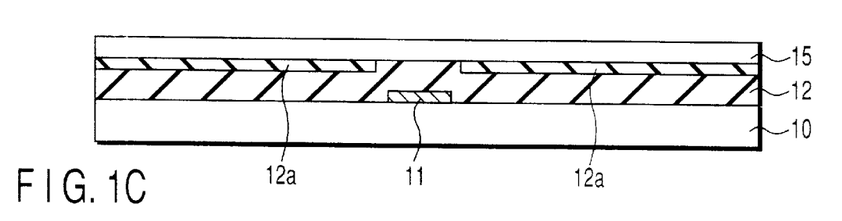

As shown in FIG. 1C, while supplying the ARM solution with about 1% of the anti-reflection material (solid contents) to the center of the semiconductor substrate 10, the semiconductor substrate 10 is spinned at 100 rpm and the ARM solution is spread under its retained fluidity over the whole surface of the interlayer insulating films 12, 12a to provide an ARM solution film. And, after the ARM solution film 12 has been formed over the whole surface of the interlayer insulating film 12, the semiconductor substrate 10 stops its spinning. In this connection it is to be noted that, even after the spinning of the semiconductor substrate 10 has been stopped, the ARM solution film 15 coated on the surfaces of the interlayer insulating films 12, 12a retains its fluidity. By, for example, allowing the spin coating of the ARM solution film in a sealed space and the setting of the sealed space under a saturated vapor pressure of the alcohol, the volatilization of the alcohol in the ARM solution film 15 is suppressed so as to maintain the fluidity of the ARM solution film 15.

Figure 1D:
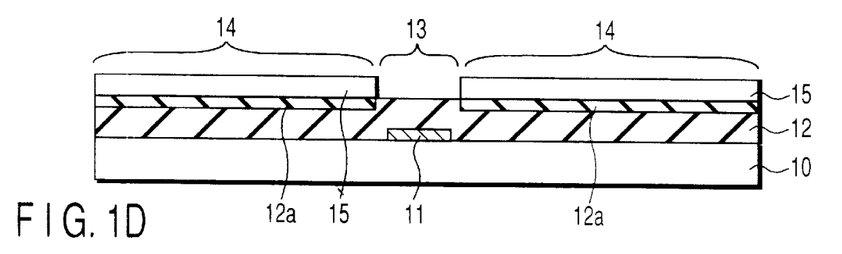
Figure 1E:
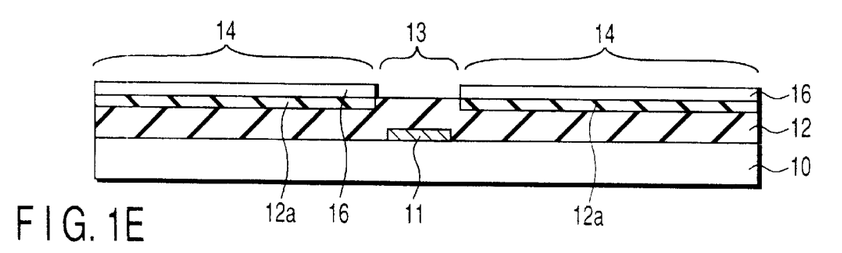

Then, the semiconductor substrate 10 is heated at 40° C. and alcohol solvent in the ARM solution film 15 is slowly volatilized. With a decreasing film thickness of the ARM solution film due to the volatilization of the solvent as shown in FIG. 1D, the ARM solution film 15 is pulled toward the filmed area 14 and so moved. At a stage of completely eliminating the solvent in the ARM solution film 15, as shown in FIG. 1E, the anti-reflection film 16 is selectively formed only on the modified interlayer insulating film 12a surface at a desired filmed area 14.

And heating processing is carried out at 200° C., the cross-linking reaction of the anti-reflection film 16 is promoted and the anti-reflection film 16 is so adjusted as to obtain a desired optical constant. The surface of the anti-reflection film 16 after this processing exhibits a hydrophobic property and an excellent film formation characteristic is revealed for a resist solution with a 4% resist material dissolved in a film formation organic solvent (EL:EEP=8:2 mixed solution).

In the ordinary film formation method, the resist solution is used to form a film on a measuring area, such as an alignment mark, not irradiated with the ArF excimer light and on the interlayer insulating film 12 with a hydrophobic surface, such as a wafer's peripheral area, etc., where there is no device pattern. Before coating the resist solution, in order not for the resist film to be formed on the anti-reflection film 16 at the non-filmed area 13, the interlayer insulating film 12 surface is modified to make the surface hydrophilic in nature.

Figure 3:
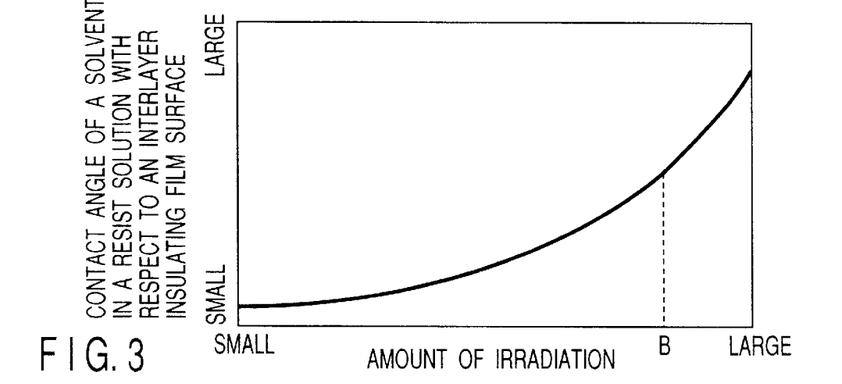
FIG. 3 is a characteristic curve showing a dependency of the wettability of an organic solvent in a resist solution to the interlayer insulating film upon an irradiation amount of the ArF excimer light.

A preliminary example has been conducted. FIG. 3 shows a relation of an irradiation amount of an ArF excimer light to the extent of modification (the wettability of the solvent in the resist solution to the interlayer insulating film surface). From FIG. 3 it has been found that, with an increasing irradiation amount of the ArF excimer light, the angle of contact of the solvent in the resist solution with respect to the interlayer insulating film surface is increased. This result indicates that, with an increase in the irradiation amount, the organic substituents on the interlayer insulating film surface are eliminated to provide a strong hydrophilic property.

Based on this result, light exposure is selectively made on the interlayer insulating film 12 with an irradiation amount B as shown in FIG. 3. If the irradiation amount B is so set as to make the angle of contact of the water with respect to the interlayer insulating film surface below 60°, a resist solution film fails to be formed on the interlayer insulating film.

Figure 1F:
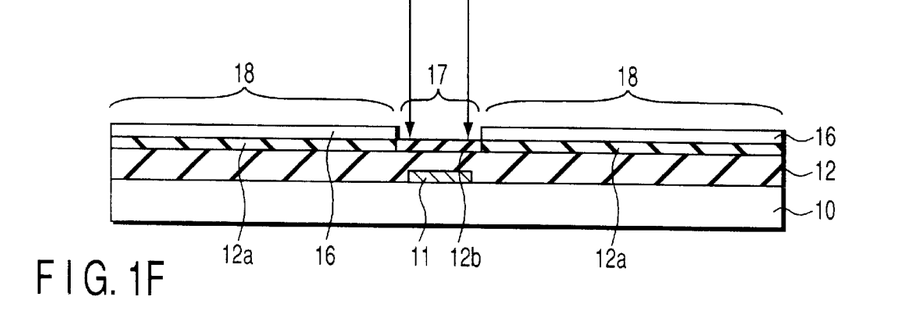

Based on the preliminary experiment, as shown in FIG. 1F, selective irradiation is preliminarily effected, with the irradiation amount B shown in FIG. 3, onto the interlayer insulating film 12 with the anti-reflection film 16 not formed thereon and, by doing so, an interlayer insulating film 12b is provided with a hydrophilically modified surface formed thereon. As a result, the hydrophilically modified surface of the interlayer insulating film 12b provides a non-filmed area 17 where the resist solution is repelled and a filmed area 18 is provided on the anti-reflection film 16 with a hydrophobic surface formed thereon.

Figure 1G:
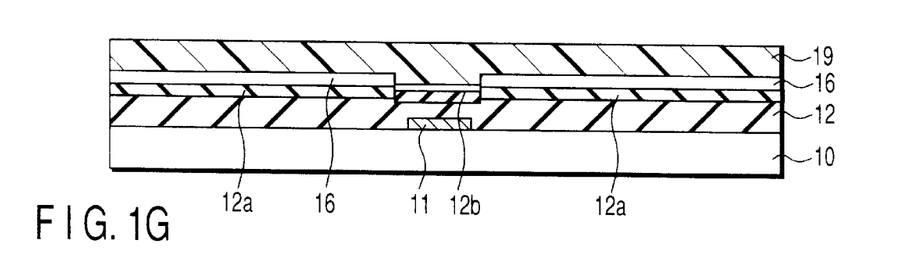

Then as shown in FIG. 1G, in the case of coating the above-mentioned ARM solution, a resist solution is supplied to a center or near-center area of the semiconductor substrate 10 and, while spinning the semiconductor substrate 10 at 100 rpm, the solution is spread over the whole surface of the semiconductor substrate 10 to provide a resist solution film 19.

Figure 1H:
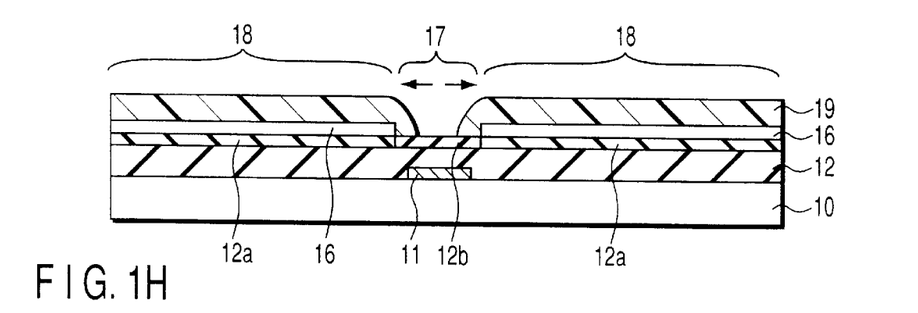

Then the semiconductor substrate 10 is heated at a lower temperature and a solvent in the resist solution film 19 is slowly volatilized. With a decreasing thickness of the resist solution film 19 resulting from the volatilization of the solvent, as shown in FIG. 1H, a resist solution film 19 on the modified interlayer insulating film 12b surface is pulled toward the filmed area 18 and so moved.

Figure 1I:
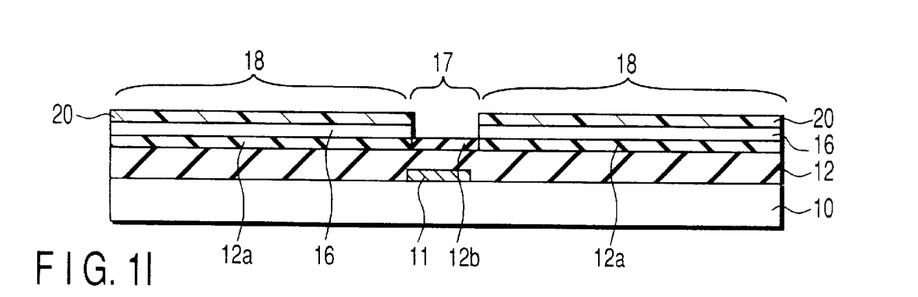

At a stage of completely removing the solvent, as shown in FIG. 1I, the resist film 20 can be selectively formed only on the anti-reflection film 16 at a desired filmed area. A patterning is done on the resist film 20 and an underlying structure is so processed.

According to the present embodiment, neither the anti-reflection film nor the resist film was formed over the alignment mark and, therefore, the alignment accuracy upon exposure was able to be remarkably improved. Further, since neither the anti-reflection film nor the resist film was formed even at the underlying pattern formation area of a positional displacement measuring area, the underlying pattern measuring was made at a high contrast and measuring accuracy was prominently improved. Further, the result of measuring of the underlying pattern was fed back to the process and designing and, by doing so, it was possible to manufacture a device of less variation in electrical characteristics and less chip area.

In the present embodiment, although the surface of the anti-reflection film is not modified prior to forming the resist solution film, it is sometimes better to modify the surface of the anti-reflection film also. In the case where use is made of the resist solution attracting the water for example, it follows that, unlike the above-mentioned case, the hydrophobic surface of the interlayer insulating film 12b repels the resist solution and a resist solution film is formed on the hydrophilic surface of the anti-reflection film 16.

Figure 4:
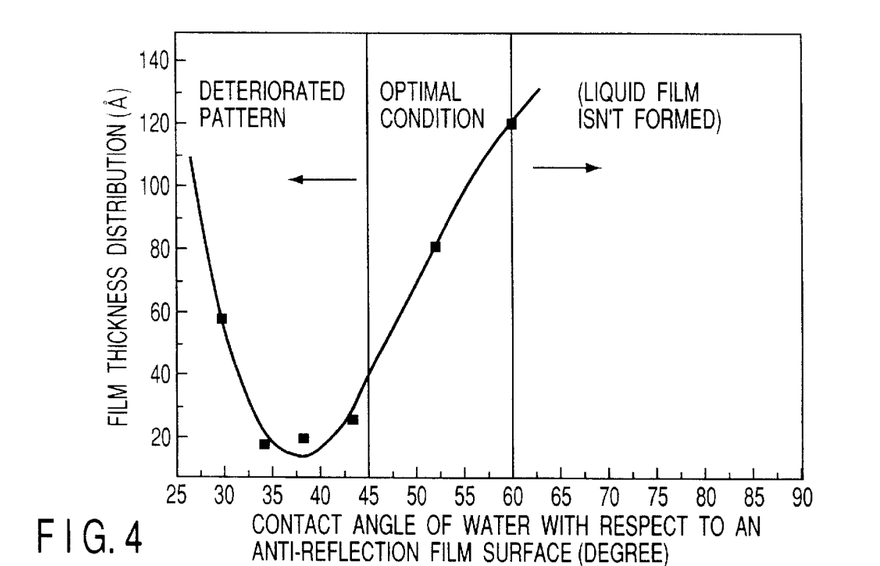
FIG. 4 is a characteristic curve showing a dependency of the wettability of an organic solvent in a resist solution to the interlayer insulating film upon an irradiation amount of the ArF excimer light.

In such a resist solution, modification is so made as to make the angle of contact with respect to the surface of the interlayer insulating film at 45° to 60°. An ester-based resist solution, such as ethyl lactate, has a similar wettability of the water and resist solution to the anti-reflection film and it is possible to argue the wettability to the anti-reflection film by referring to the water. FIG. 4 shows the dependency of the thickness distribution of the water film formed on the anti-reflection film upon the contact angle of the water with respect to the anti-reflection film surface.

As shown in FIG. 4, when the contact angle of the water with respect to the anti-reflecting film surface is below 45°, the pattern of the water film is downgraded and it becomes difficult to selectively form a water film. When the contact angle of the water with respect to the anti-reflection film surface is above 60°, then the anti-reflection film surface repels the water and no water film is formed on the anti-reflection film surface. Therefore, the contact angle a of the water with respect to the anti-reflection film surface is $45° \leq \theta \leq 60°$, it is possible to form a water film of a better pattern.

For the case of an ester-based resist solution such as ethyl lactate, it is preferable that the surface of the anti-reflection film be so modified as to set the contact angle θ of the water with respect to the surface of the anti-reflection film at $45° \leq \theta \leq 60°$.

Figure 5A:
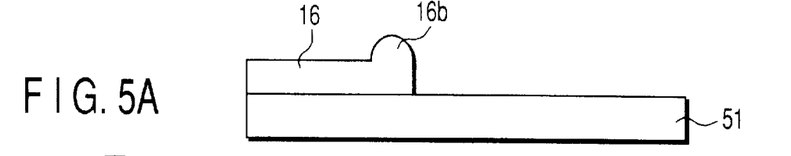
FIGS. 5A and 5B show a state of an anti-reflection film when a to-be-processed substrate surface is modified with ultraviolet light irradiated from a homogeneous light source onto the substrate surface in an in-focused way and the amount of the ultraviolet light irradiated onto the substrate surface, and a contact angle of water with respect to the substrate.
Figure 5B:
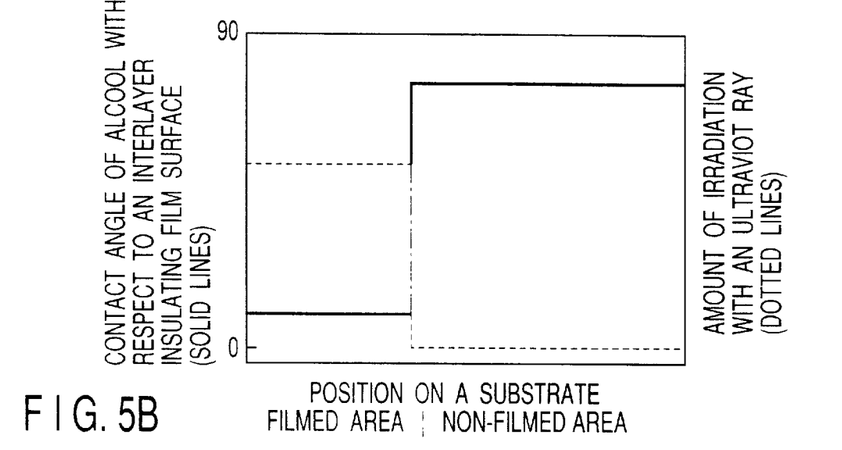

Incidentally, according to the present embodiment, the filmed area and non-filmed area are provided by forming selectively modified surfaces. As shown in FIG. 5A, when light is irradiated, while being set in focus, onto the surface of a to-be-processed substrate 51 with the use of a well-uniform light source, a coagulated area 16b occurs at the edge of the anti-reflection film 16 and, if this happens, a crack may occur from that area as the case may be. FIG. 5B shows a relation of an amount of ultraviolet light irradiated onto the to-be-processed substrate 51 to the contact angle of alcohol with respect to the substrate 51 at that time.

It is preferable that the extent of modification slowly vary at a boundary between the filmed area and the non-filmed area. If the intensity of the irradiation slowly varies, then the extent of hydrophobicity slowly varies in accordance with an amount of ultraviolet light irradiated.

Figure 6A:
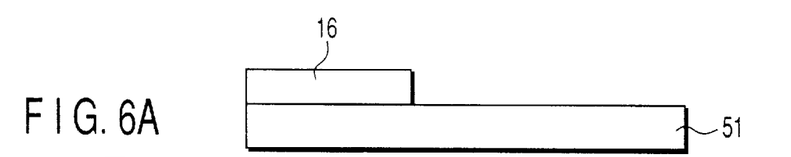
FIGS. 6A and 6B show a state of an anti-reflection film when the extent of modification is slowly varied at a boundary between a filmed area and a non-filmed area and an amount of ultraviolet light irradiated onto a to-be-processed substrate surface, and an angle of water with respect to the substrate.
Figure 6B:
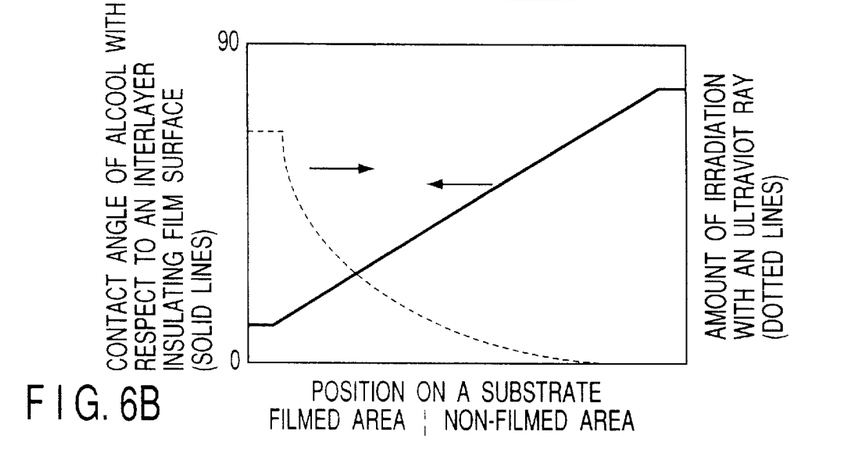

When the extent of hydrophobicity varies slowly, as shown in FIG. 6A, it is possible to prevent any coagulation at the edge of an anti-reflection film 16 which is formed at a non-filmed area on the surface of the to-be-processed substrate 51. Incidentally, FIG. 6B shows an exposure radiation of the ultraviolet light irradiated onto the substrate 51 and the contact angle of alcohol with respect to the substrate 51. Giving a variation to the irradiation amount can be achieved with the use of a light ray, or a radiation ray, having a light amount distribution in a direction horizontal to the substrate or by setting its focal point in a state of defocusing from the surface of the substrate.

As the modifying light use can be made of light of a wavelength λ of less than 300 nm, an electron beam, X-ray, etc.

[Second Embodiment]

In connection with the second embodiment, explanation will be given below about the method of coating an SOG onto a semiconductor substrate surface and baking a film to provide an interlayer insulating film; with the use of an anti-reflection material (ARM) solution with the anti-reflection material added to an alcohol solvent and a resist solution with a photosensitive material added to the solvent, sequentially and selectively forming the solution film and stacking an anti-reflection film and resist film by doing so.

FIGS. 7A to 7H are cross-sectional views showing the selective film formation steps according to the second embodiment of the present invention. In the second embodiment, the same reference numerals are employed to designate parts or elements corresponding to those shown in FIGS. 1A to 1l.

Figure 7A:
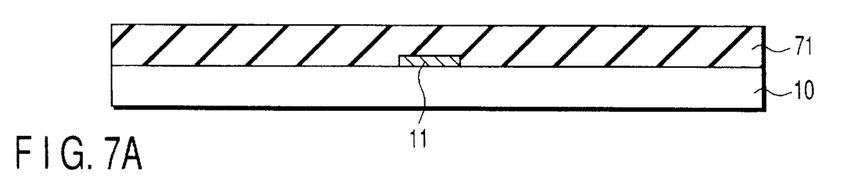
FIGS. 7A to 7H are cross-sectional views showing a selective film formation process according to a second embodiment of the present invention.

As shown in FIG. 7A, an interlayer insulating film 71 with a hydrophobic surface formed is provided on a semiconductor substrate 10 with the use of the same method as the first embodiment.

The surface of the interlayer insulating film 71 is hydrophobic in nature and repels an alcohol solvent in the ARM solution and attracts an organic-based solvent (EL:EEP=7:3 mixed solution) in a resist solution containing a 4% of solid contents such as a photosensitive material.

ArF excimer light (193 nm) was irradiated onto the surface of the interlayer insulating film 71 at a measuring area, such as an alignment mark, and at a non-filmed area, such as a wafer's peripheral area, where no device pattern is present. By doing so, the surface of the interlayer insulating film 71 was modifies so as to repel the alcohol solvent and organic solvent.

Figure 8:
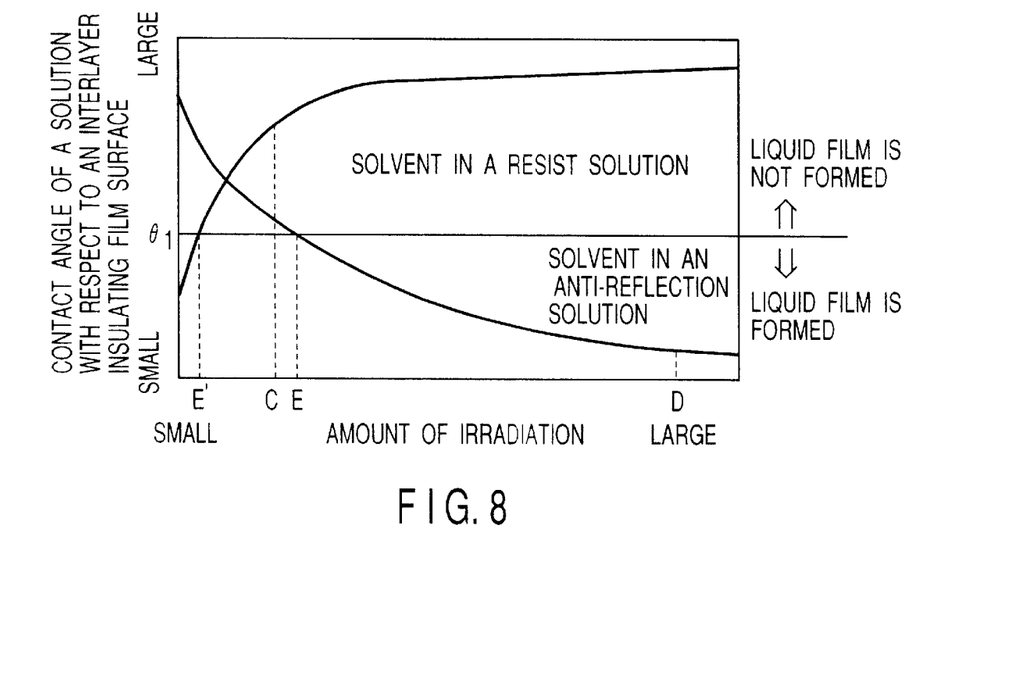
FIG. 8 is a characteristic curve showing a relation of an irradiation amount of ArF excimer light to the extent of wettability to an anti-reflection material and resist solution.

A preliminary experiment was carried out. FIG. 8 shows a relation between the irradiation amount of the ArF excimer light and an extent of modification (the wettability of the solvent in the ARM solution and resist solution to an element isolation insulating film). It has been found that, as shown in FIG. 8, the more the irradiation amount of the ArF excimer light, the smaller the contact angle of the solvent (alcohol) in the ARM solution with respect to the interlayer insulating film and the greater the contact angle of the solvent in the resist solution with respect to the interlayer insulating film.

The extent of wettability of the solvent drastically varied for a variation of the contact angle of the solvent with respect to the interlayer insulating film. The extent of wettability of the solvent does not gradually vary in accordance with a variation of the contact angle of the solvent with respect to the interlayer insulating film but attracting and repelling occurs between the solvent and the interlayer insulating film at a given boundary angle.

Since the solvent in the ARM solution and solvent in the resist solution have their wettability to the interlayer insulating film drastically varied with a contact angle θ1 as a boundary as shown in FIG. 8, if the element isolation insulating film is modified at an irradiation amount a of $E' \leq a \leq E$, repelling occurs on both the ARM solution film and resist solution film. Further, if the element isolation insulating film is modified at the irradiation amount a of $a \geq E$, then the ARM solution film is formed.

Figure 7B:
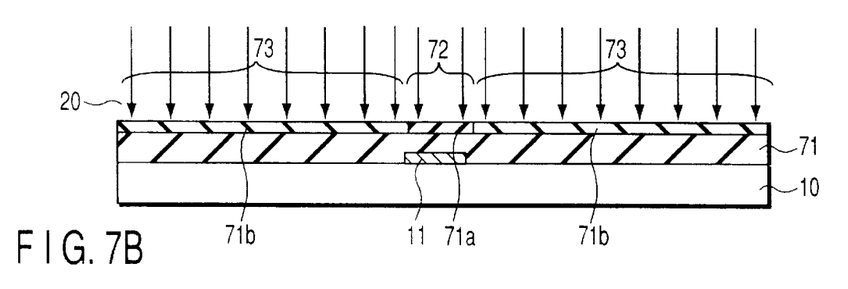

Based on this result, selective light exposure is done at an irradiation amount D (FIG. 8) on the area where the anti-reflection film of the interlayer insulating film 71 is formed and at an irradiation amount C on those areas (a measuring area such as an alignment mark, wafer's peripheral area with a device pattern not present) where a anti-reflection material/resist material is not filmed. And as shown in FIG. 7B, a high-modified interlayer insulating film 71b involving a greater ArF light irradiation amount and low-modified interlayer insulating film 71a involving a smaller ArF light irradiation amount are formed on the interlayer insulating film 71. The surface of the high-modified interlayer insulating film 71b is a place where a filmed area 73 with the anti-reflection film and resist film is formed and the surface of the low-modified interlayer insulating film is a place where a non-filmed area 72 is formed.

Figure 7C:
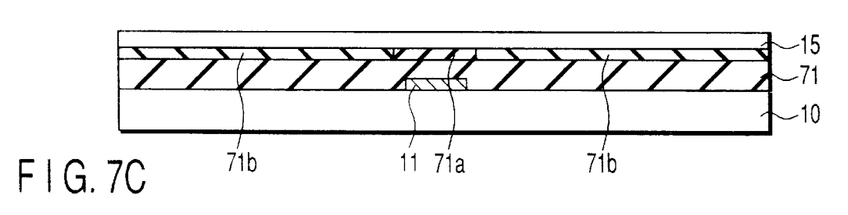

Then as shown in FIG. 7C, while supplying an ARM solution containing an about 1% of solid contents to a center or near-center of a semiconductor substrate 10, the semiconductor substrate 10 is spinned at 100 rpm to spread the solution over the whole surface of the semiconductor substrate 10 to form an ARM solution film 15.

Figure 7D:
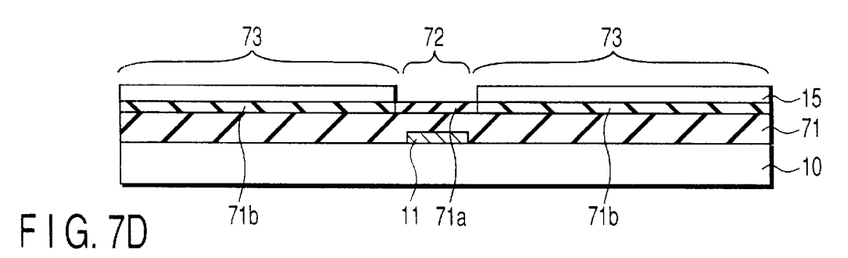
Figure 7E:
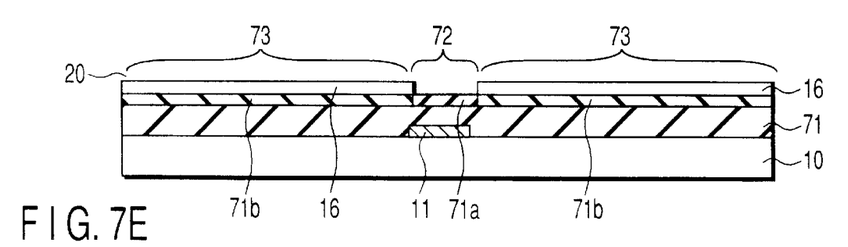

Then as shown in FIG. 7D, the semiconductor substrate 10 is heated at 40° C. to allow a solvent in the ARM solution film 15 to be slowly volatilized. With a decreasing thickness of the ARM solution film 15 resulting from the volatilization of the solvent, the ARM solution film 15 on the non-filmed area 72 was pulled toward a filmed area 73 and so moved. At the stage of completely eliminating the solvent in the ARM solution film 15, as shown in FIG. 7E, the anti-reflection film 16 was selectively formed on the high-modified interlayer insulating film 71b at a filmed area.

Further, a cross-linking reaction in the anti-reflection film 16 is promoted at a heating temperature of 200° C. and adjustment is so made as to obtain a desired optical constant. The surface of the anti-reflection film 16 after this processing reveals a hydrophobic property (the contact angle is shallow with respect to the solvent in the resist solution) and better film formation characteristics are exhibited for a resist solution containing 4% of solid contents in an organic solvent (EL:EEP=7:3 mixed solvent) for film formation.

Figure 7F:
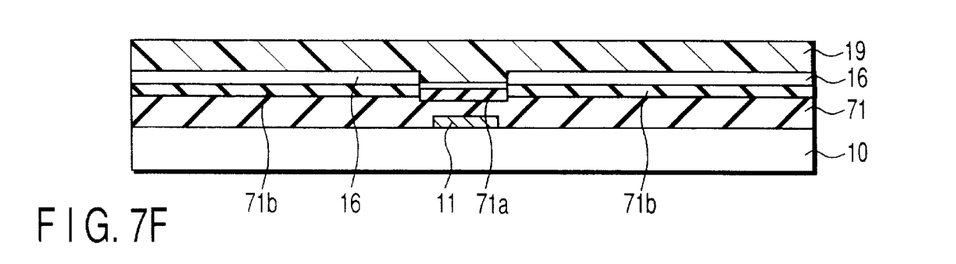
Figure 7G:
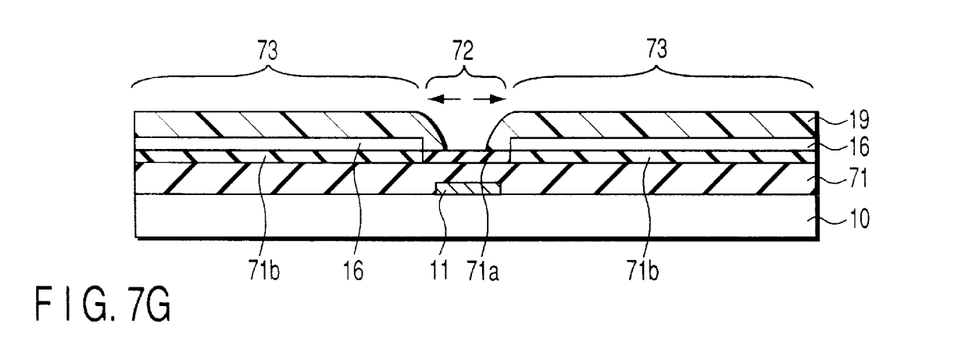
Figure 7H:
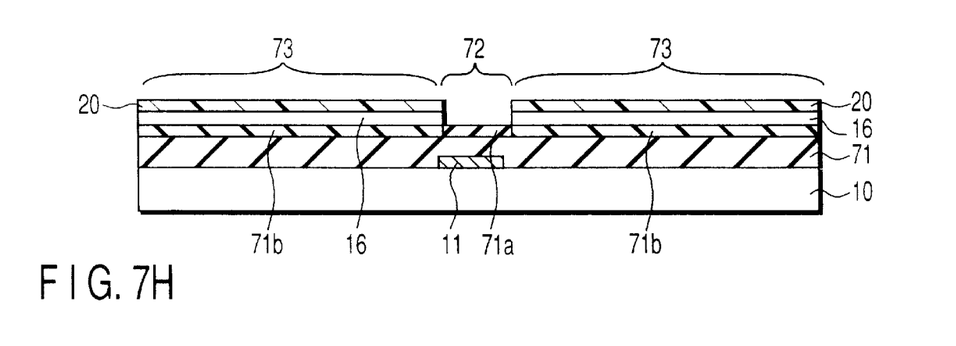

Then as shown in FIG. 7F, while supplying a resist solution to the center of the semiconductor substrate 10 as in the case of coating the above-mentioned ARM solution, the semiconductor substrate 10 is spinned at 100 rpm to allow the solution to be spread over the whole surface of the semiconductor substrate 10. By doing so, a resist solution film 19 is formed. Then as shown in FIG. 7G, the semiconductor substrate 10 is heated at a low temperature of, for example, 40° C. to allow the solvent in the resist solution film to be slowly volatilized. With a decreasing thickness of the resist solution film 19 resulting from the volatilization of the solvent, the resist solution film 19 at the non-filmed area 72 is pulled toward the filmed area 73 and so moved. At the stage of completely eliminating the solvent in the resist solution film 19, as shown in FIG. 7H, a resist film 20 was selectively formed only on the anti-reflection film 16 at a desired filmed area 73. A patterning was performed on the resist film 20 with the use of the lithography technique, followed by the effecting of underlying processing.

According to the present embodiment, an advantage is obtained in that, in addition to the same effect as in the first embodiment, it is only necessary to effect an exposure step only once.

Although in the present embodiment the filmed area and non-filmed area are formed through the selective surface modification, it is preferable that, as in the case of the first embodiment, the extent of modification be slowly varied at a boundary area between the filmed area and the non-filmed area.

Figure 9:
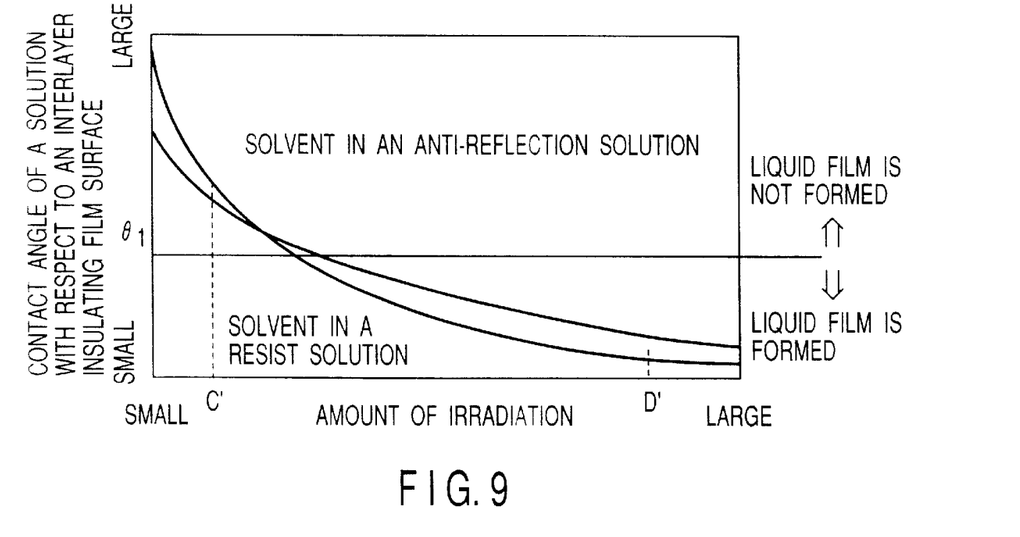
FIG. 9 is a characteristic curve showing a relation of an irradiation amount of ArF excimer light to the extent of wettability to an anti-reflection material an resist solution.

Although in the above-mentioned embodiment use is made of the resist solution repelled on the hydrophilically modified surface, some resist solution, though depending upon itself, is attracted on the hydrophilical surface. For the case of a resist solution having the characteristic as shown, for example, in FIG. 9, it is only necessary to impart an exposure amount D' to an anti-reflection film formation area. A resist solution containing, for example, EL (ethyl lactate) as a solvent is attracted onto the hydrophilic surface and, hence, it is not necessary to effect light exposure with an irradiation amount C in the present embodiment.

On the other hand, it is preferable to modify the surface of the anti-reflection film so that it exhibits a hydrophilic property. It is to be noted that the greater the extent of modification on the anti-reflection film surface the smaller the extinction efficiency of the anti-reflection film and the weaker the anti-reflection capability. For this reason, it is preferable that modification be effected desirably at the angle θ of 45°<θ<60° with respect to water.

[Third Embodiment]

The third embodiment relates to a method comprising thinly forming a film allowing a hydrophilic-hydrophobic conversion under the irradiation of an ultraviolet ray on the surface of a to-be-processed substrate and selectively irradiating an ultraviolet ray of a wavelength 172 nm on the thin film to provide a hydrophilic-hydrophobic area and, by doing so, selectively forming an anti-reflection film and resist film.

FIGS. 10A to 10E are cross-sectional views showing a selective film forming steps according to the third embodiment of the present embodiment. In FIGS. 10A to 10E, the same reference numerals are employed to designate parts or elements corresponding to those shown in FIGS. 1A to 1I and any further explanation is, therefore, omitted.

Figure 10A:
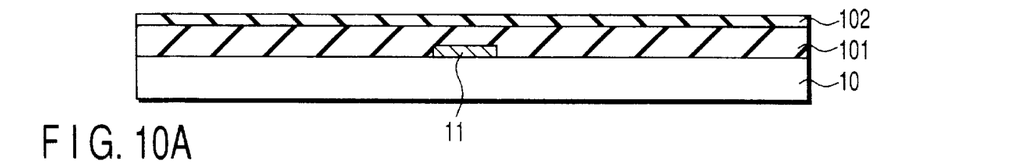
FIGS. 10A to 10E are cross-sectional views showing a selective film formation process according to a third embodiment of the present invention.

First, as shown in FIG. 10A, an SOG material is coated on a semiconductor substrate 10 and, by an ordinary baking step, an interlayer insulating film 101 is formed. A titanium oxide containing paint composition film 102 is formed as a 1 nm-thick film on the interlayer insulating film 101. It is to be noted that the titanium oxide containing paint composition film 102 was prepared by diluting an anatase type titanium oxide sol/silica sol mixture with an ethanol and adding methytrimethoxysilane to it. It has been found that the contact angle of water with respect to the surface of the titanium oxide containing paint composition film 102 was about 70° C. and it reveals a high affinity for an ARM solution.

Figure 10B:
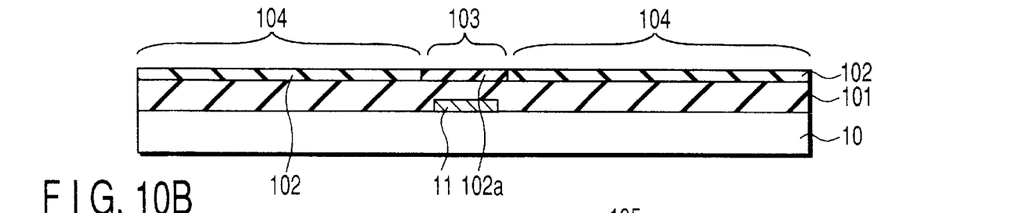

Then as shown in FIG. 10B, an ultraviolet ray is selectively irradiated at those non-filmed areas of an anti-reflection material and resist agent on the titanium oxide containing paint composition film 102 to provide a surface-modified layer 102a. The modified surface of the layer 102a revealed a strong hydrophilic property and the contact angle of the water with respect to the modified layer 102a was made as small as 10°. It has been found that the modified surface of the layer 102a at a non-filmed area 103 repels the ARM solution and resist solution. An area, not irradiated with an ultraviolet ray, where the non-surface-modified paint composition film 102 is formed, provides a filmed area 104.

Figure 10C:
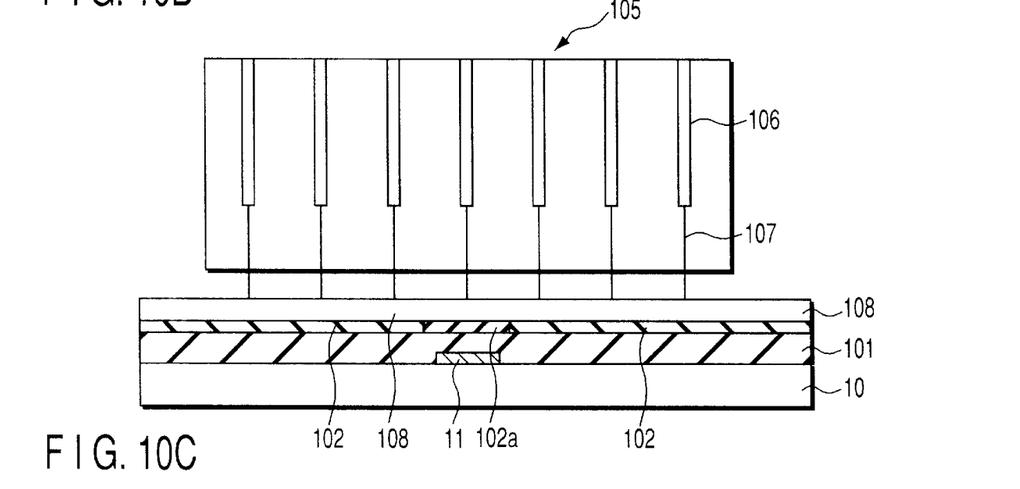

Then as shown in FIG. 10C, an ARM solution 107 is dropwise supplied from solution supply nozzles 106 onto the titanium oxide containing paint composition film 102 to provide an ARM solution film 108. Incidentally, at the formation of the ARM solution film 108, a semiconductor substrate 10 was horizontally set on a sample stage not shown; and a drop unit 105 comprised of a plurality of solution supply nozzles 106 and set above the semiconductor substrate 10 supplied an ARM solution dropwise onto the semiconductor substrate 10 from the solution supply nozzles 106, while reciprocating the drop unit in one direction relative to the semiconductor substrate. The bore of the solution supply nozzle 106 used is circular and 40 μm in diameter. It is to be noted that, in order not to allow a solvent in the ARM solution film 108 to be volatilized, an operation was done within a sealed container and its atmosphere was controlled.

Figure 10D:
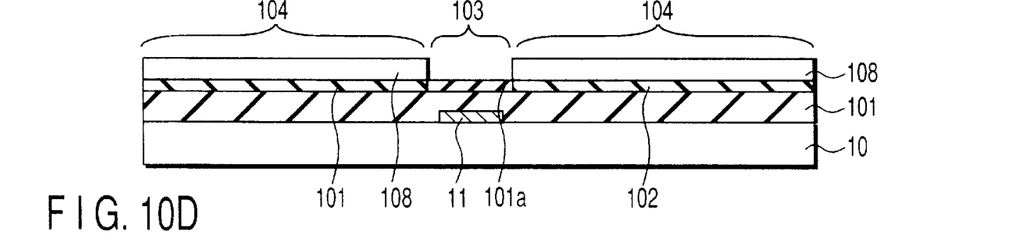
Figure 10E:
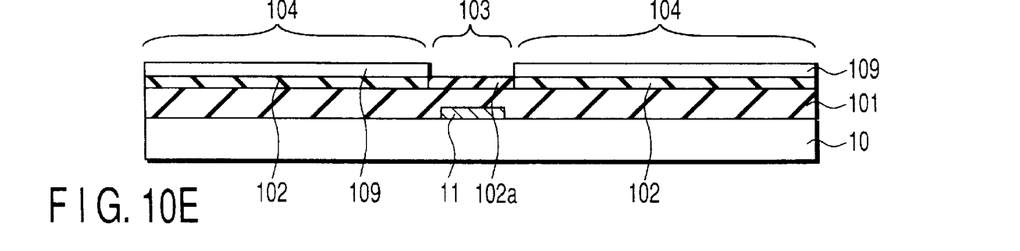

Then the semiconductor substrate 10 was heated and the solvent in the ARM solution film 108 was slowly volatilized. With a thickness decreasing of the ARM solution film 108 resulting from the volatilization of the solvent, as shown in FIG. 10D, the ARM solution film 108 at a non-filmed area 103 was pulled toward a filmed area 104 and so moved. At the stage of completely volatilizing the solvent, as shown in FIG. 10E, an anti-reflection film 109 was formed at those areas other than the non-filmed area.

In the present embodiment, since the anti-reflection film and resist film were not formed on an alignment mark, it was possible to drastically improve the alignment accuracy upon exposure. Further, by reflecting the improved alignment accuracy, on the designing of the device it was possible to reduce a chip area while achieving less variation in electrical characteristics.

As in the present embodiment, it is preferable that the extent of surface modification be slowly varied at a boundary area between the filmed area and the non-filmed area. Further, although in the above-mentioned embodiment use is made of, as a film forming material, the interlayer insulating film of the SOG, the present invention is not restricted thereto. Any material such as a polysilane film may be applicable if a surface state is varied by being irradiated with a radiation ray such as an ultraviolet ray. Any light source may be used for processing if it contains a wavelength with which the to-be-processed substrate surface is modified. Use can be made of a charged corpuscular beam such as an electron beam and X-ray beam.

[Fourth embodiment]

The present embodiment relates to a method comprising modifying a hydrophilic interlayer insulating film to a hydrophobic film through gas adsorption and selectively forming an ARM film and resist film as hydrophobic areas.

Figure 11A:
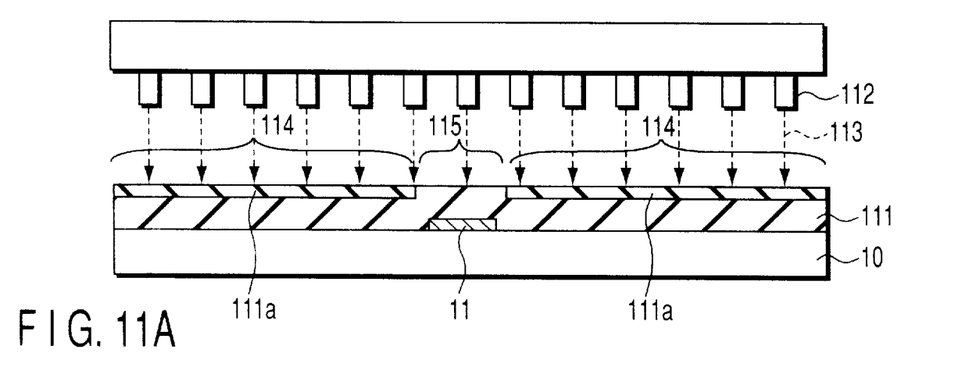
FIGS. 11A to 11C are cross-sectional views showing a selective film formation process according to a fourth embodiment of the present invention.
Figure 11B:
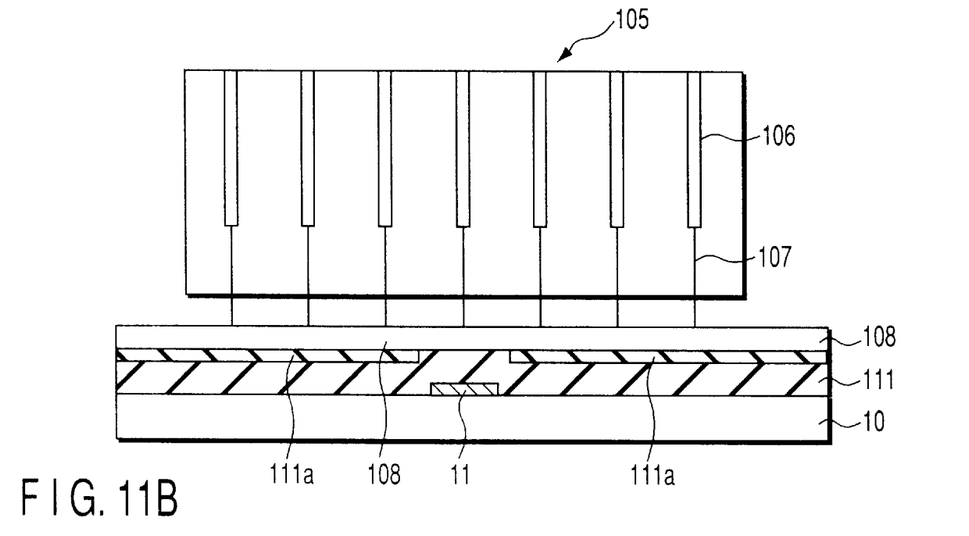
Figure 11C:
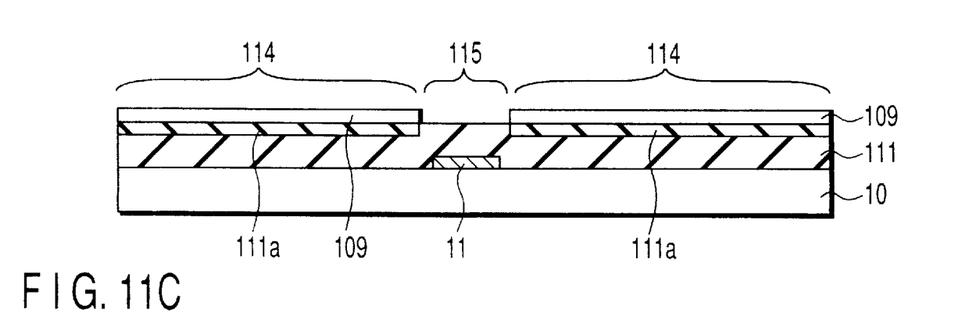

FIGS. 11A to 11C are cross-sectional views showing a selective film forming step according to the fourth embodiment of the present invention. In FIGS. 11A to 11C, the same reference numerals are employed to designate parts or elements corresponding to those shown in FIG. 10 and any further explanation is, therefore, omitted.

First, as shown in FIG. 11A, an SOG solution is coated on a semiconductor substrate 10 and baked to provide an interlayer insulating film 111 having a hydrophilic surface. Since an ARM solution cannot be coated on a hydrophilic surface of the interlayer insulating film, a chlorodifluoroethylene gas 113 is selectively blown via gas nozzles 112 onto an anti-reflection film formation area. By adsorbing the chlorodifluoroethylene gas 113 on the surface of the interlayer insulating film, an interlayer insulating film 111a is formed whose surface is modified to a hydrophobic one. The area where the surface-modified interlayer film 111a is formed is a filmed area 114. The contact angle of water with respect to the surface of the hydrophobically modified interlayer insulating film 111a, upon being measured, was 55°. It has been found that the ARM solution and resist solution are attracted onto the surface of the interlayer insulating film 111a.

Incidentally, there occurs no adsorption of the chlorodifluoroethylene gas 113 and an area where the interlayer insulating film 101 with a surface not modified is formed provides a non-filmed area 115 corresponding to the anti-reflection film and resist film.

Then as shown in FIG. 11B, an ARM solution film 108 is formed on the interlayer insulating film 111 with the use of the same technique as in the third embodiment. Then the semiconductor substrate 10 was heated to 40° C. and a solvent in the ARM solution film 108 was slowly volatilized. With a decreasing thickness of the ARM solution film 108 resulting from the volatilization of the solvent, the ARM solution 108 at the non-filmed area on the interlayer insulating film 111 is pulled toward the interlayer insulating film 101a at the filmed area and so moved. At the stage of completely eliminating the solvent in the ARM solution film 108, as shown in FIG. 11c, an anti-reflection film 109 can be selectively formed at the filmed area 114 on the interlayer insulating film 111a.

Further, heating was carried out at 200° C. and a cross-linking reaction of the anti-reflection film 109 was promoted and adjustment was so made as to obtain a desired optical constant. The surface of the anti-reflection film 109 after this processing exhibits a hydrophobic property (the contact angle with respect to the solvent in the resist solution is low). A better film formation characteristic is revealed for the resist solution containing 4% of solid contents in the organic-based solvent (EL:EEP=7:3 mixed solution) for film formation. A similar film formation is done even for the resist solution.

In the present embodiment, the anti-reflection film and resist film were not formed over the alignment mark and it was possible to drastically improve the alignment accuracy upon exposure. Further, since the anti-reflection film and resist film were not formed even with respect to an underlying pattern formation area at a positional displacement measuring area, the underlying pattern measurement was able to be carried out at a high contrast and the measuring accuracy was also able to be prominently improved. By feeding this back to the process and designing, it was possible to form a device of less variation in electric characteristics and less chip area.

In the present embodiment, although the filmed area and non-filmed area have been formed through the selective adsorption of the gas and the resultant surface modification, it is preferred that the extent of modification be slowly varied at these boundary areas. Upon blowing a gas, the extent of modification is slowly varied at the boundary area of the filmed area and non-filmed area to allow the diffusion of the gas.

[Fifth embodiment]

The present embodiment relates to a method comprising thinly forming a film allowing a conversion to a hydrophobic surface state through gas adsorption and to a hydrophilic surface state through an irradiation with an ultraviolet ray onto the surface of a to-be-processed substrate and selectively forming an anti-reflection film and resist film to have partially hydrophilic and partially hydrophobic surfaces.

FIGS. 12A to 12D are cross-sectional views showing a selective film forming process according to a fifth embodiment of the present invention.

Figure 12A:
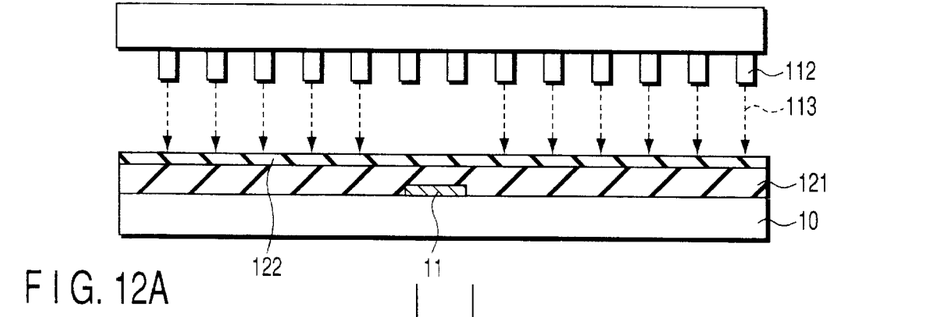
FIGS. 12A to 12D are cross-sectional views showing a selective film formation process according to a fifth embodiment of the present invention.

First as shown in FIG. 12A, an SOG is coated onto a semiconductor substrate 10 and baked to provide an interlayer insulating film 121. And a titanium oxide type paint composition film 122 is formed as a 1 nm film on the interlayer insulating film 121.

The titanium oxide containing paint composition was prepared by diluting an anatase type titanium oxide sol/silica sol mixture with an ethanol and adding a methyltrimethoxysilane to it.

Since, upon coating an ARM solution used in the present invention, a higher hydrophobic property than in the third and fourth embodiment is required for a filmed surface, a chlorodifluoroethylene gas is blown onto a whole surface of the titanium oxide containing paint composition film 122 and further the hydrophobic property of the paint composition film 122 is enhanced. The contact angle of water with respect to the surface of the paint composition film 122 after processing was 85° upon being measured.

Figure 12B:
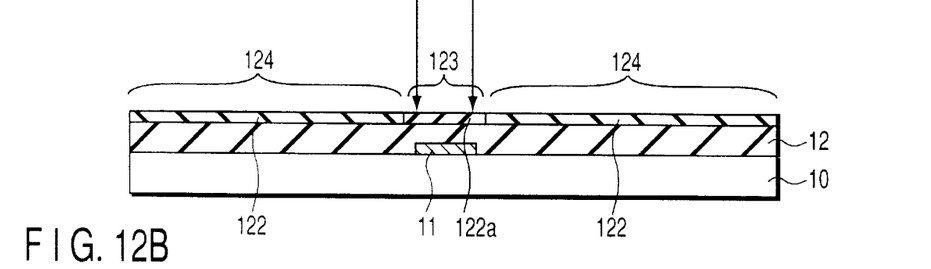

Then as shown in FIG. 12B, an ultraviolet ray is selectively irradiated onto those non-coated areas corresponding to the anti-reflection film and resist film on the paint composition film 122 to provide a modified layer 122*a* having a high hydrophilic surface. On the surface of the modified layer 122*a* irradiated with the ultraviolet ray, the contact angle of water with respect to the modified layer 122*a* was 10° and this higher hydrophilic property was able to give the property of repelling the ARM solution and resist solution. For this reason, an area where a modified layer 122*a* is formed becomes a non-filmed area 123 while an area corresponding to the paint composition film 122 not irradiated with an ultraviolet ray becomes a filmed area 124.

Figure 12C:
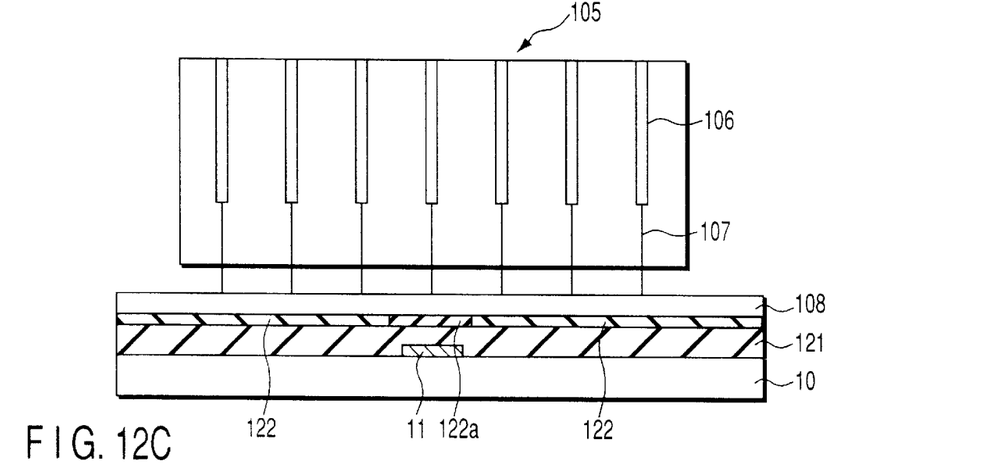

Then as shown in FIG. 12C, with the use of the same technique as in the fourth embodiment, an ARM solution 107 with an organic solvent is dropwise supplied onto the titanium oxide containing paint composition film 122 to provide an ARM solution 108.

Figure 12D:
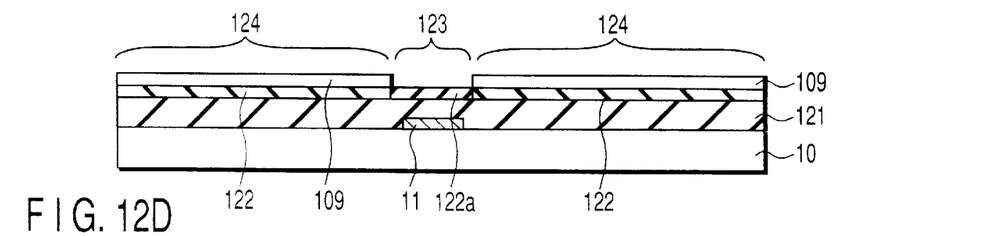

Then the semiconductor substrate 10 is heated at 40° C. to allow a solvent in the ARM solution film 108 to be slowly volatilized. With a decreasing thickness of the ARM solution film 108 resulting from the volatilization of the solvent, the ARM solution film 108 on the non-filmed area 123 is pulled toward a filmed area 124 and so moved. At the stage of completely eliminating the solvent, it was possible to selectively form an anti-reflection film 109 at a predetermined filmed area only as shown in FIG. 12D.

Heating was made at 200° C., the cross-linking reaction of the anti-reflection film was promoted and adjustment was so made as to obtain a desired optical constant. The surface of the anti-reflection film 109 after this processing reveals a hydrophobic property (the contact angle with respect to the solvent in the resist solution is low) and a better film characteristic was shown for a resist solution containing 4% of solid contents in an organic-based solvent (EL:EEP=7:3 mixed solvent) for film formation. A film formation was made even for the resist solution.

In the present invention, since neither the anti-reflection film nor the resist film was formed over the alignment mark, it was possible to prominently improve the alignment accuracy upon exposure. Further, either the anti-reflection film nor the resist film was formed even at an underlying pattern area on a positional displacement measuring area. And the underlying pattern measuring was able to be obtained at a high contrast and the measuring accuracy was also remarkably improved. By feeding this back to the process and designing it was possible to prepare a device of less variation in electric characteristics and less chip area.

Although, in the above-mentioned embodiment, a filmed area and non-filmed area were formed through the selective surface modification, it is preferable that the extent of modification be slowly varied to these boundary areas.

It is only necessary that a light source for processing have a wavelength with which the processing substrate surface is modified. It is also possible to use a charged corpuscular ray such as an electron ray and X-ray. The gas used is not restricted to the chlorodifluoroethylene gas.

Further, the present invention is not restricted to the above-mentioned embodiments. Although the interlayer insulating film using the SOG is used as a film formation object, the present invention is not restricted thereto and use can be made of a resist material, interlayer insulating material, electroconductive material, interconnection material, etc. Even for the solvent, anything can be applied if the wettability of a filmed surface varies depending upon the extent of a radiation ray with which the surface is irradiated.

Although, in the above-mentioned embodiment, the SOG has been shown as the interlayer insulating film taking an organic siloxane containing film by way of example, a polysilane containing an organic silicon compound having an Si—Si linkage as a main chain is used, for the anti-reflection film, as an organic siloxane film containing the organic siloxane.

Various changes or modifications of the present invention can be made without departing from the spirit and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film forming method including the steps of forming a solution film, by dropwise supplying a solution containing solid contents in a solvent and volatilizing the solvent, and selectively forming a film of the solid contents on a to-be-processed substrate at predetermined areas, the method comprising the steps of:

selectively irradiating an energy beam onto the substrate surface to allow the substrate surface to be modified and forming a filmed area having a high affinity for the solvent and a non-filmed area having a low affinity for the solvent;

dropwise supplying the solution to the substrate surface and forming the solution film; and volatilizing the solvent from the solution film and, by doing so, forming a solid contents film selectively on the substrate surface selectively at filmed areas.

2. A film forming method according to claim 1, wherein the energy beam is light having a wavelength of below 250 nm and the energy beam is so irradiated as to have its irradiation amount monotonically decreased from an irradiated area toward a non-irradiated area.

3. A film forming method according to claim 1, wherein the step of forming the solution film comprises, while dropwise supplying the solution via solution supply nozzles provided above the substrate, moving the substrate and solution supply nozzles relative to each other.

4. A film forming method according to claim 1, wherein the non-filmed area is an area other than a mark for positional alignment upon light exposure, an area having a mark for measuring light exposure positional misalignment and a semiconductor chip area.

5. A film forming method according to claim 1, wherein, as the solution, use is made of a solution containing, as the solid contents, a material selected from the group consisting of an anti-reflection material, resist material, low dielectric material, insulating material and interconnection material.

6. A film forming method according to claim 1, wherein the filmed area has a contact angle θ of water with respect to the anti-reflection film which ranges in 45°≦θ≦60°.

7. A film forming method including the steps of forming a solution film, by dropwise supplying a solution containing solid contents in a solvent and volatilizing the solvent, and selectively forming a film of the solid contents on a to-be-processed substrate at predetermined areas, the method comprising the steps of:

selectively irradiating an energy beam onto the semiconductor substrate at least with a first irradiation amount and a second irradiation amount and forming a filmed area irradiated with the first irradiation amount and a non-filmed area irradiated with a second irradiation amount, the filmed area having a high affinity for a first solvent in a first solution film directly coated on the surface of the substrate and the non-filmed area having a low affinity for a solvent in at least one solution film coated on the substrate surface after forming a first film through a volatilization of the first solvent in the first solution film;

by volatilizing the first solvent after forming the first solution film on the substrate surface, selectively forming a first film on the substrate surface at the filmed area; and selectively forming one or more films over the first film by the solution film forming step and solvent volatilizing step.

8. A film forming method according to claim 7, wherein the energy beam is light having a wavelength of below 250 nm and the energy beam is so irradiated as to have its irradiation amount monotonically decreased from the filmed area toward the non-filmed area.

9. A film forming method according to claim 7, wherein the step of forming the solution film comprises, while dropwise supplying the solution from solution supply nozzles provided above the substrate, moving the substrate and solution supply nozzles relative to each other.

10. A film forming method according to claim 7, wherein the non-filmed area is an area other than a mark for positional alignment upon light exposure, an area having a mark for measuring light exposure positional misalignment, and a semiconductor chip area.

11. A film forming method according to claim 7, wherein, as the solution, use is made of a solution containing, as the solid contents, a material selected from the group consisting of an anti-reflection material, resist material, low dielectric material, insulating material and interconnection material.

12. A film forming method according to claim 7, wherein the solution is a resist solution and the substrate surface irradiated with the energy beam provides an anti-reflection film, the filmed area has a contact angle θ of water with respect to the anti-reflection film which ranges in $45° \leq \theta \leq 60°$, and the non-filmed area has a contact angle of the water with respect to the anti-reflection film which exceeds 60°.

13. A film forming method including the steps of forming a solution film, by dropwise supplying a solution containing solid contents in a solvent and volatilizing the solvent, and selectively forming a film of the solid contents on a semiconductor substrate which is situated at a predetermined area over an organic siloxane film formed through baking of an organic siloxane (SiO—Si), the method comprising the steps:

selectively irradiating an energy beam on a surface of the organic siloxane film to allow the surface of the semiconductor substrate to be modified, and forming a filmed area having a high affinity for the solvent and a non-filmed area having a low affinity for the solvent;

dropwise supplying the solution on the organic siloxane film to provide the solution film; and, by volatilizing the solvent from the solution film, forming a film of the solid contents at the filmed area over the surface of the organic siloxane film.

14. A film forming method according to claim 13, wherein a contact angle of water with respect to the filmed area is below 60° and a contact angle of the water with respect to the non-filmed area is above 60°.

15. A film forming method according to claim 13, wherein the organic siloxane film is comprised of an interlayer insulation film or an anti-reflection film.

16. A film forming method according to claim 13, wherein the energy beam is light of a wavelength of below 200 nm and the energy beam is so irradiated as to have an irradiation amount monotonically varied from the filmed area toward the non-filmed area.

17. A film forming method according to claim 13, wherein the step of forming the solution film comprises, while dropwise supplying the solution from solution supply nozzles provided above the semiconductor substrate, moving the substrate and solution supply nozzles relative to each other.

18. A film forming method according to claim 13, wherein the filmed area is an area other than a mark for positional alignment upon exposure, an area having a mark for measuring light exposure positional misalignment and a semiconductor chip area.

19. A film forming method according to claim 13, wherein, as a solution, use is made of a solution containing, as the solid contents, a material selected from the group consisting of an anti-reflection material, resist material, low dielectric material, insulating material, and interconnection material.

* * * * *